United States Patent [19]
Chang et al.

[11] Patent Number: 5,206,585
[45] Date of Patent: Apr. 27, 1993

[54] METHODS FOR TESTING INTEGRATED CIRCUIT DEVICES

[75] Inventors: David D. C. Chang; Edward L. Smith, Jr., both of Lawrenceville, N.J.

[73] Assignee: AT&T Bell Laboratories, Murray Hill, N.J.

[21] Appl. No.: 801,213

[22] Filed: Dec. 2, 1991

[51] Int. Cl.$^5$ ............................................. G01R 1/073
[52] U.S. Cl. ................................ 324/158 P; 324/72.5
[58] Field of Search ................ 324/158 P, 158 F, 72.5

[56] References Cited

U.S. PATENT DOCUMENTS

| | | | |
|---|---|---|---|
| 4,548,862 | 10/1985 | Hartman | 428/323 |
| 4,571,542 | 2/1986 | Arai | 324/158 P |
| 4,642,421 | 2/1987 | Dery et al. | 174/88 |
| 4,735,847 | 4/1988 | Fujiwara et al. | 428/209 |
| 4,820,376 | 4/1989 | Lambert et al. | 156/643 |
| 4,923,521 | 5/1990 | Liu et al. | 134/5 |

OTHER PUBLICATIONS

"Elastomeric Connectors–Attributes, Comparison, and Potential", by W. R. Lambert et al., *Proceedings of the National Electronic Packaging and Production Conference*, vol. 3, pp. 1512–1526, Feb. 1991.
"Applications and Reliability of the AT&T Elastomeric Conductive Polymer Interconnection (ECPI) System", by J. A. Fulton et al., *Proceedings of the International Electronics Packaging Conference*, Marlboro, Mass., pp. 930–943, Sep. 1990.
"Flip-Chip Soldering to Bare Copper Circuits", by A. P. Ingraham et al., *Proceedings of the Fortieth Electronic Components and Technology Conference*, Las Vegas, Nev., pp. 333–337, May 1990.

*Primary Examiner*—Ernest F. Karlsen
*Attorney, Agent, or Firm*—R. B. Anderson

[57] ABSTRACT

A method for testing an integrated circuit (IC) chip (10) in accordance with the invention comprises the step of forming a solder bump (14) on each of an array of bonding pads (13) on a first surface of the chip, in accordance with the known flip-chip method of IC device packaging. Each of the solder bumps (14) is inserted through an aperture (25) in a spacer member (22), the spacer member having a smaller thickness than the length of each solder bump, whereby each solder bump protrudes through an aperture. The solder bumps are then placed on a layer of anisotropic conductive material (11) which is arranged over an array of test fixture conductive pads so that the anisotropic conductive layer is sandwiched between the IC chip and the test fixture. The integrated circuit chip is then compressed against the anisotropic conductor material to establish electrical contact between the solder bumps of the integrated circuit chip and the test fixture conductor pads (17). The testing of the chip then proceeds by passing electrical current through the solder bumps, the anisotropic material, and the test fixture conductor pads in a known manner.

8 Claims, 3 Drawing Sheets

METHODS FOR TESTING INTEGRATED CIRCUIT DEVICES

TECHNICAL FIELD

This invention relates to methods for testing integrated circuit chips and, more particularly, to such methods which employ a layer of anisotropic conductive material for conducting current between solder bumps on the integrated circuit device and conductive pads of a test fixture.

BACKGROUND OF THE INVENTION

The papers, "Elastomeric Connectors-Attributes, Comparisons, and Potential," by W. R. Lambert et al., *Proceedings of the National Electronic Packaging and Production Conference*," Vol. 3, pp. 1512–1526, February 1991, and "Applications and Reliability of the AT&T Elastomeric Conductive Polymer Interconnection (ECPI) System," by J. A. Fulton et al., *Proceedings of the International Electronics Packaging Conference*," Marlboro, Mass., pp. 930–943, September 1990, and the U.S. patent of Lambert et al., U.S. Pat. No. 4,820,376, all hereby incorporated herein by reference, describe the use of anisotropic conductive material for interconnecting electronic devices. Anisotropic conductive material is material in the form of a flat sheet that conducts electrical current across its thickness only and not in the length or width dimensions. The references discuss a particular kind of anisotropic conductive material known as Elastomeric Conductive Polymer Interconnect (ECPI) material which comprises chains of conductive particles which are magnetically aligned in columns in an elastomeric matrix to provide conduction only in the thickness of Z direction. It is known that such materials can be used to provide a dependable interconnection between an array of conductors on a device to be tested with an array of conductors on a test fixture. The electronic device to be tested is typically mechanically compressed against the ECPI material to give dependable electrical interconnection to conductor pads of the test fixture.

The paper, "Flip-Chip Soldering to Bare Copper Circuits," by A. P. Ingraham et al., *Proceedings of the Fortieth Electronic Components and Technology Conference*, Las Vegas, Nev., pp. 333–337, May 1990, is an example of the prior art that describes a method for packaging and connecting integrated circuit chips known as flip-chip bonding or soldering. With this method, all terminals of the integrated circuit chip are located as conductor pads on one surface of the chip with a solder bump applied to each conductor pad. The chip is then mounted on a substrate with each solder bump contacting a conductor pad of the circuit to which it is to be connected. The apparatus is heated to reflow the solder and cause it to adhere to the conductor pads of the substrate so that thereafter the solder bumps constitute both an electrical interconnection and a bonding member for securing the integrated circuit chip to the substrate. Applying the solder bumps to the bonding pads of the integrated circuit can result in malfunctions if placement is not accurate, and so it is customary to test the integrated circuit chip after it has been permanently bonded to the substrate. A drawback of this process is that, if the chip fails test, the solder bumps must be remelted so that the chip can be removed, and remnant solder must be cleaned from the substrate to avoid bridging or short circuits when the chip is replaced. The U.S. patent of Liu et al., U.S. Pat. No. 4,923,521, is an example of prior art describing methods for removing remnant solder.

It would be desirable to provide a method for testing integrated circuit chips after the solder bumps have been applied but before permanent bonding to the substrate. For this purpose, we have tried to use ECPI to provide a temporary interconnect between the solder bumps and contact pads of a test fixture. Unfortunately, we have found that the straightforward use of ECPI material in this manner does not provide reliable test results. There is therefore a continuing long-felt need in the industry for better methods for testing electronic devices, particularly flip-chip integrated circuit devices having an array of solder bumps on one surface.

SUMMARY OF THE INVENTION

A method for testing an integrated circuit (IC) chip in accordance with the invention comprises the step of forming a solder bump on each of an array of bonding pads on a first surface of the chip, in accordance with the known flip-chip method of IC device packaging. Each of the solder bumps is inserted through an aperture in a spacer member, the spacer member having a smaller thickness than the length of each solder bump, whereby each solder bump protrudes through an aperture. The solder bumps are then placed on a layer of anisotropic conductive material which is arranged over an array of test fixture conductive pads so that the anisotropic conductive layer is sandwiched between the IC chip and the test fixture. The integrated circuit chip is then compressed against the anisotropic conductor material to establish electrical contact between the solder bumps of the integrated circuit chip and the test fixture conductor pads. The testing of the chip then proceeds by passing electrical current through the solder bumps, the anisotropic material, and the test fixture conductor pads in a known manner.

As will be discussed in more detail below, the use of the spacer member distributes the strsses within the anisotropic conductive material so as to maintain a proper insulative separation between adjacent conductive elements or columns of the material. It is the bulging of the conductive elements that has been found to lead to anomalous breakdown and other problems leading to unreliability, in the absence of the spacer member.

These and other objects, features, and advantages of the invention will be better understood from a consideration of the following detailed description taken in conjunction with the accompanying drawing.

DETAILED DESCRIPTION

Figure 1:
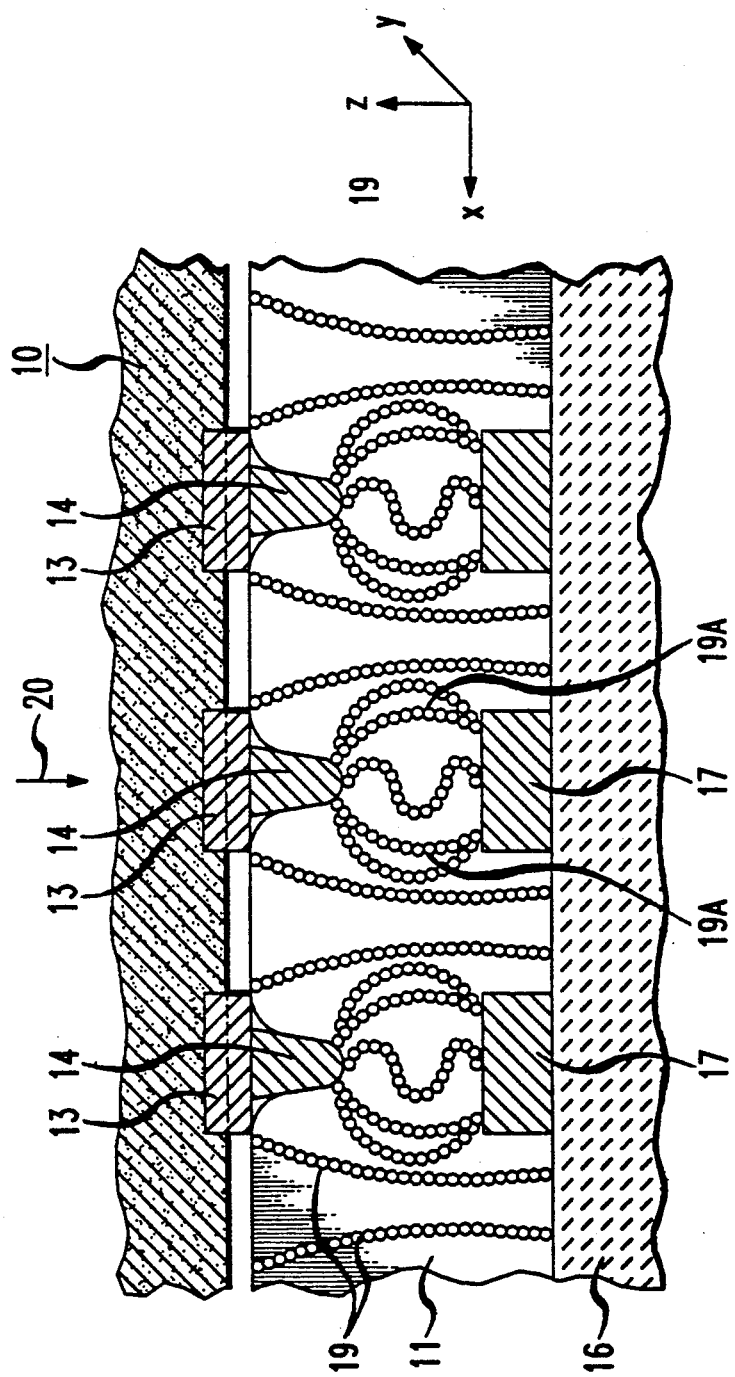
FIG. 1 is a sectional schematic view showing the use of ECPI material for interconnecting solder bumps of an integrated circuit to conductor pads of a test fixture.

Referring now to FIG. 1, there is illustrated a method for testing an integrated chip device 10 using a layer 11 of ECPI material which acts as an anisotropic conductor as described generally in the aforementioned papers of Lambert et al. and Fulton et al. and the patent of Lambert et al. The integrated circuit 10 has an array of bonding pads 13 upon each of which has been formed a solder bump 14 for the purpose of eventually permitting "flip-chip" bonding as generally described in the aforementioned Ingraham et al. paper. The ECPI material 11 overlies a test fixture comprising a substrate 16 containing an array of conductor pads 17. It is to be understood that the array of solder bumps 14 and the matching array of conductor pads 17 may each constitute a matrix array of conductors as is generally consistent with the apparatus described in the Ingraham et al. paper. The drawing is not intended to be to scale.

The purpose of the ECPI material 11 is to provide a temporary interconnection between each solder bump 14 and a corresponding opposite one of the array of conductor pads 17 of the substrate 16. The ECPI material comprises an array of columns 19 of conductors which contain ferromagnetic material for permitting them to be magnetically aligned within a polymer matrix. That is, the conductive columns are made by impressing a magnetic field through the material with the polymer in a fluid uncured condition to permit the particles to form the columns 19 which are fixed in place by allowing the polymer matrix to harden, thereby forming the ECPI material 11. A compressive force schematically shown by arrow 20 is applied to the integrated circuit chip 10, as shown, to force the solder bumps 14 to make good electrical contact with conductive columns 19. Our experience with the apparatus of FIG. 1 is that it is generally unreliable, at least for testing integrated circuits having a fine pitch. That is, if the center-to-center distance of the bonding pads is sufficiently close together so as to require a distance between adjacent columns 19 of about eight mils, the ECPI material is considered fine pitch material having a pitch equal to eight mils. The solder bumps 14 each may have a nominal length of about four mils.

We have analyzed the structure of FIG. 1 to determine the reasons for its unreliability, and have determined that the compression of the solder bumps 14 into the ECPI material, as shown, exerts lateral forces on the conductive columns 19. That is, the applied force 20 is in the Z direction, but this is translated into forces on the columns 19 in the X and Y directions. With a fine pitch, this means that certain adjacent columns are distorted to be closer than eight mils, which may lead to spurious breakdown between adjacent columns 19 that are at different electrical voltages. The result of these lateral forces is shown by the "bulging out" of columns 19A that directly contact the solder bumps 14.

Figure 2:
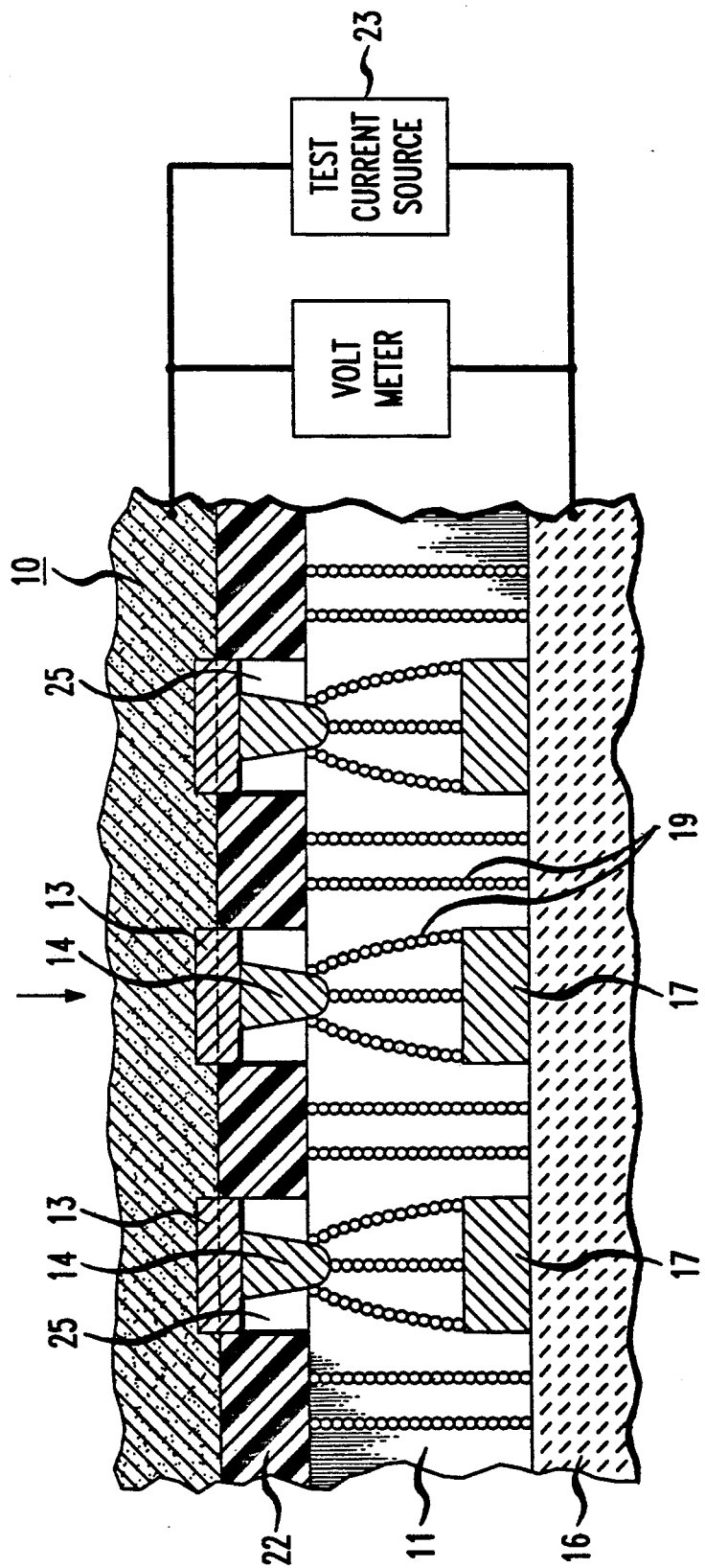
FIG. 2 is a sectional schematic view showing the use of ECPI materials in accordance with an illustrative embodiment of the invention.

Referring to FIG. 2, this problem is solved by using a spacer member 22 between the integrated circuit chip 10 and the ECPI layer 11. This spacer member 22 reduces the penetration of the solder bumps 14 into the ECPI material 11, and it translates applied forces to the ECPI layer between adjacent solder bumps 14, thereby reducing the generation of component forces in the X and Y directions. As a consequence, the distortion of the vertical conductor columns 19 is greatly reduced so that the conduction paths between solder bumps 14 and conductor pads 17 are made more reliable. Thus, current from a test source 23 can be conducted through the integrated circuit 10, the solder bumps 14, and the conductor columns 19 to the conductor pads 17 of the test fixture for giving reliable readings of test current through the integrated circuit. The spacer also protects the chip 10 from the ECPI layer 11 to prevent possible contamination of the chip surface by particles from the ECPI layer.

Figure 3:
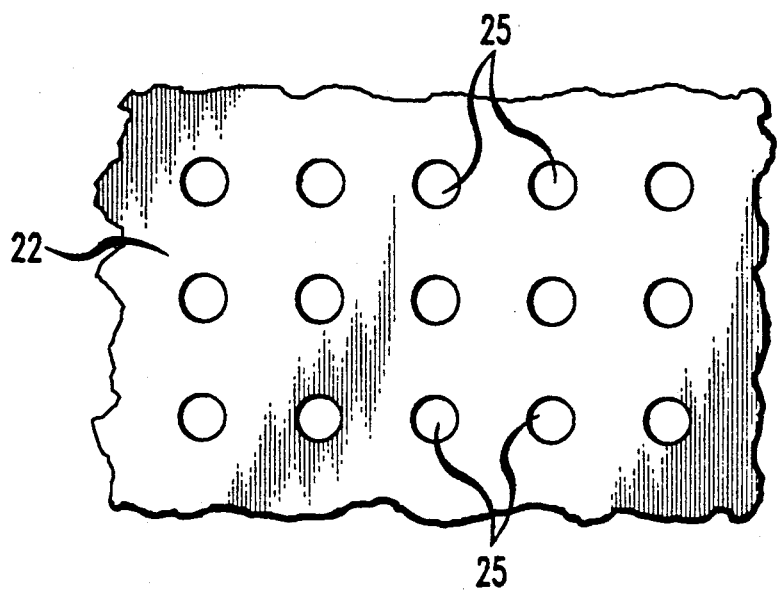
FIG. 3 is a view of part of the spacer member of FIG. 2.

As mentioned before, the solder bumps 14 are typically arranged in a matrix array. Referring to FIG. 3, the spacer member 22 should then be made with apertures 25 each of which corresponds to the location of one of the solder bumps 14. The apertures 25 are of sufficient diameter, typically less than about ten mils, to permit each of the solder bumps 14 to protrude through the aperture as shown in FIG. 2. The spacer member 22 may be made of any of various materials such as polyimide, and the apertures 25 may be made in any of various ways. For example, the apertures may be made by photolithographic masking and etching or, alternatively, they may be made by laser drilling. The aperture spacing of course reflects the solder bump spacing which is typically less than fifteen mils center-to-center.

Figure 4:
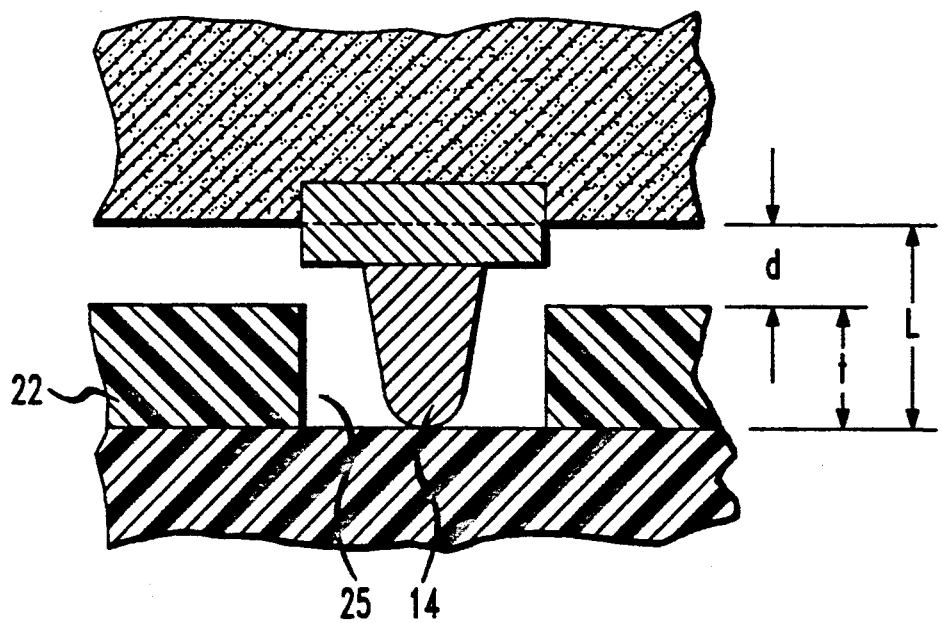
FIG. 4 is a schematic view showing the relationship of solder bump length with thickness of the spacer material of the embodiment of FIG. 2.

FIG. 4 shows the relationship of the length L of the solder bump 14 with respect to the thickness t of the spacer 22 and the compression d of the ECPI material during operation. It is assumed that there is substantially no compression of the spacer 22, although this is not essential to the operation of the invention. The thickness t should be smaller than the length L so that each of the solder bumps 14 can protrude through an aperture 25 under compression. The compression d should be sufficient to insure good electrical contact but should not be so great as to produce significant bulging as was discussed with reference to FIG. 1. Typically, with eight mil pitch ECPI material, L may be four mils, t may be three mils, and d may be one mil. If there is a significant variation in the length 1, one may wish to make the thickness t a little smaller to insure protrusion by each of the solder bumps 14. As is known, careful sieving techniques should be used to assure that all of the conductive particles are appropriately small when fine pitch ECPI material is being made. The dimensions of the solder bumps including the length L are normally dictated by the requirements of flip-chip bonding. That is, after testing, the IC chip will normally be permanently bonded to the circuit of a substrate by melting or "reflowing" the solder bumps so that they each bond to a conductor pad of the circuits. Referring to FIG. 2, IC bonding pads 13 have a typical thickness of about 0.8 microns, while bonding pads 17 may have a thickness of 0.7 to 1.4 mils.

It is to be understood that the invention, while it is particularly applicable to the testing of flip-chip integrated circuits, is applicable to any electronic device in which the protruding of conductors or the like causes lateral or transverse forces on the conductive columns, as described with reference to FIG. 1. Further, the invention may be used with anisotropic conductors other than ECPI layers, such as anisotropic conductors that use metal pins extending across the layer thickness to provide unidirectional interconnection. Various other embodiments and modifications may be made by those skilled in the art without departing from the spirit and scope of the invention.

We claim:

1. A method for testing an integrated circuit chip comprising the steps of:

making an array of solder bumps on one surface of the integrated circuit chip, at least certain ones of the solder bumps having center-to-center spacings of less than about fifteen mils;

interconnecting at least certain ones of the solder bumps to at least certain ones of conductor pads of a test fixture;

said interconnecting step comprising the steps of, first, placing on the conductor pads a layer of anisotropic conductive material comprising a plurality of columns of conductive particles each extending across the thickness of the layer, second, placing the integrated circuit chip on the anisotropic conductive layer with the solder bumps contacting the anisotropic conductive layer, and third, compressing the integrated circuit chip against the anisotropic conductive layer with sufficient force to establish electrical interconnection between at least certain ones of said solder bumps and at least certain ones of the conductor pads by way of at least certain ones of said columns of conductive particles;

and testing the integrated circuit chip comprising the step of directing electrical current through the integrated circuit chip, at least some of the solder bumps, at least some of the columns of conductive particles, and at least some of the test fixture conductor pads;

wherein, prior to the interconnecting step, each solder bump is inserted through an aperture in a spacer member, the spacer member having a smaller thickness than the length of each solder bump, thereby to reduce the physical distortion of the anisotropic layer during the compression step and reducing the likelihood of spurious breakdown between adjacent conductive columns.

2. The method of claim 1 wherein:
the anisotropic conductive layer comprises a layer of ECPI material.

3. The method of claim 2 wherein:
the length of each solder bump is approximately equal to the sum of the thickness of the spacer member and the compression of the ECPI during test.

4. The method of claim 1 wherein:
each of the apertures in the spacer member has a diameter of less than about ten mils.

5. The method of claim 1 wherein:
the electronic device is an integrated circuit chip and the protruding solder bumps have dimensions suitable for flip-chip bonding of the integrated circuit to a substrate circuit.

6. The method of claim 5 wherein:
the length of each solder bump is approximately equal to the sum of the thickness of the spacer member and the compression of the anisotropic conductive layer.

7. The method of claim 6 wherein:
the anisotropic conductive layer comprises a layer of ECPI material.

8. The method of claim 7 wherein:
the solder bumps form a matrix array having a center-to-center spacing of less than about fifteen mils; and the ECPI has a pitch of about eight mils.

* * * * *